United States Patent [19]

Davis et al.

[11] Patent Number: 5,197,076
[45] Date of Patent: Mar. 23, 1993

[54] TEMPERATURE STABILIZABLE LASER APPARATUS

[76] Inventors: James G. Davis, 259 Sherwood Ave., Rochester, N.Y. 14619; Gregory N. Heiler, 212 Buttonwood Dr., Hilton, N.Y. 14468; Mark D. Bedzyk, 124 Rye Rd., Rochester, N.Y. 14626

[21] Appl. No.: 792,844

[22] Filed: Nov. 15, 1991

[51] Int. Cl.$^5$ ............................................... H01S 3/04
[52] U.S. Cl. ........................................ 372/34; 372/29; 372/43; 372/38
[58] Field of Search .................. 372/34, 43, 28, 344, 372/29

[56] References Cited

U.S. PATENT DOCUMENTS

| | | | |
|---|---|---|---|
| 4,297,713 | 10/1981 | Ichikawa et al. | 346/108 |
| 4,338,577 | 7/1982 | Sato et al. | 372/36 |
| 4,351,005 | 9/1982 | Imai et al. | 346/108 |
| 4,399,541 | 8/1983 | Kovats et al. | 372/36 |
| 4,500,865 | 2/1985 | Tanaka et al. | 338/13 |
| 4,604,753 | 8/1986 | Sawai | 372/36 |
| 4,656,635 | 4/1987 | Baer et al. | 372/27 |
| 4,661,959 | 4/1987 | Kaneko | 372/34 |
| 4,803,689 | 2/1989 | Shibanuma | 372/36 |
| 4,805,296 | 2/1989 | Jinda et al. | 29/620 |
| 4,884,279 | 11/1989 | Odagri | 372/29 |
| 4,910,741 | 3/1990 | Pillsbury et al. | 372/29 |
| 4,922,480 | 5/1990 | Bosch | 370/3 |
| 4,924,471 | 5/1990 | Clark et al. | 372/34 |
| 4,948,221 | 8/1990 | Yates | 350/96.20 |
| 4,993,801 | 2/1991 | Sarraf | 350/96.20 |
| 5,005,178 | 4/1991 | Kluitmans et al. | 372/36 |
| 5,019,769 | 5/1991 | Levinson | 372/31 |
| 5,029,335 | 7/1991 | Fisher et al. | 372/36 |
| 5,042,042 | 8/1991 | Hori et al. | 372/32 |
| 5,058,124 | 10/1991 | Cameron et al. | 372/34 |

FOREIGN PATENT DOCUMENTS

| | | | |
|---|---|---|---|
| 0260180 | 12/1985 | Japan | 372/34 |
| 172813 | 7/1989 | Japan | . |
| 238612 | 9/1989 | Japan | . |
| 238613 | 9/1989 | Japan | . |

Primary Examiner—Georgia Y. Epps

[57] ABSTRACT

Laser apparatus containing an electrically operated laser (laser diode) is temperature stabilized so that it is able to generate a beam of laser light of sufficient intensity to be suitable for use in a laser printer without entering a failure mode due to overheating. The laser diode is integrated into a hybrid thick film integrated circuit wherein the laser diode is bonded to one side of the hybrid's substrate of thermally conductive and electrically insulating material of the hybrid. The hybrid has conductors thereon which are connected to the leads from the laser diode. A circuit containing temperature sensitive material (elements formed of positive or negative temperature co-efficient resistive material) is distributed in spaced areas on the opposite side of the hybrid's substrate from the laser diode. The distributed thermistor circuit and its close thermal coupling to the cooler and the diode laser reduce thermal mass (capacitance), which must be heated or cooled, to maintain athermal conditions. A control circuit responsive to the thermistor resistance which includes a proportional gain stage which follows rapid changes in thermistor resistance and an integral stage which prevents slow changes in thermistor resistance from rendering the temperature unstable, provides current in the proper direction through the cooler so as to maintain and stabilize the temperature of the laser.

17 Claims, 5 Drawing Sheets

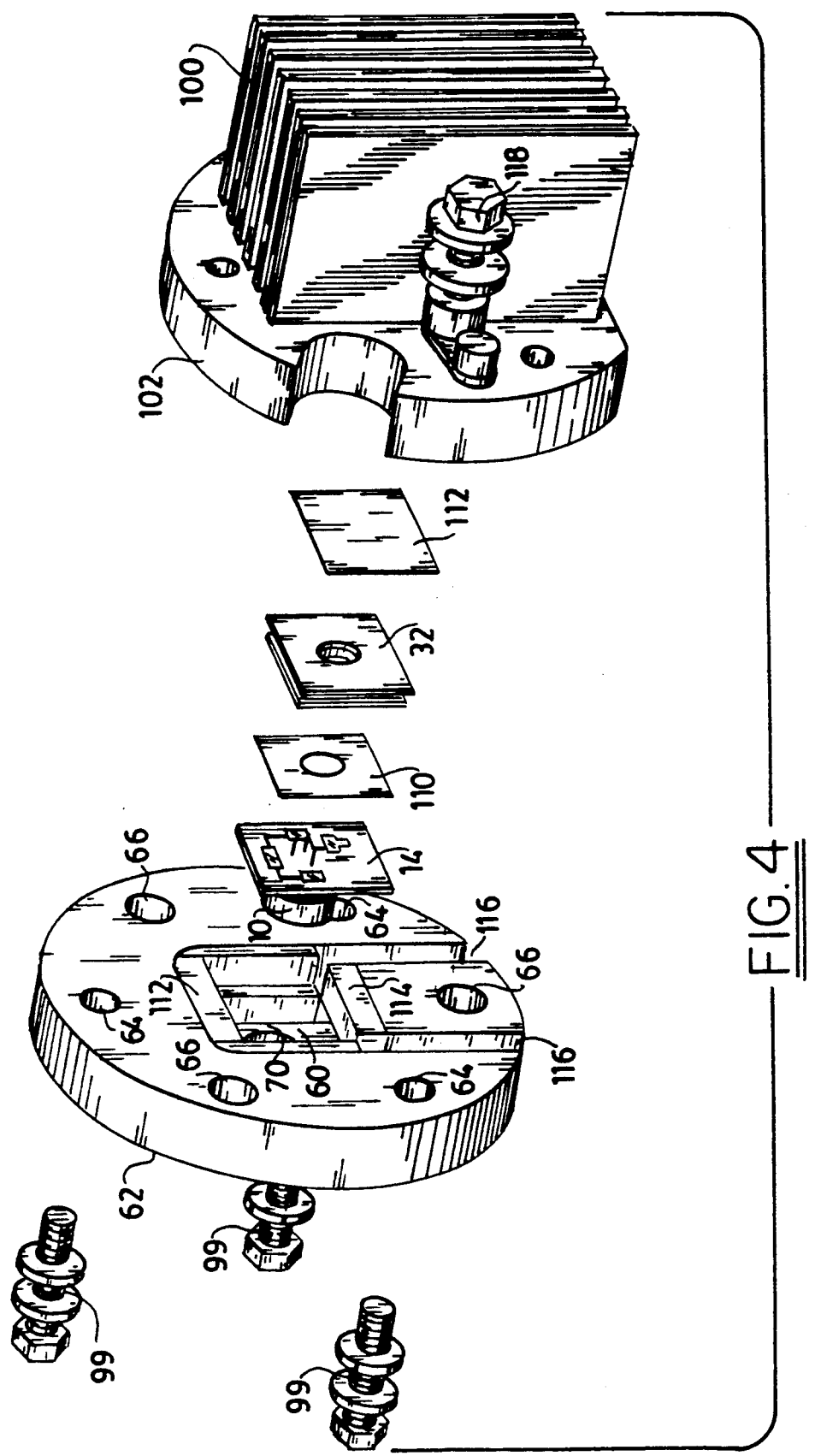

TEMPERATURE STABILIZABLE LASER APPARATUS

BACKGROUND OF THE INVENTION

The present invention relates to laser apparatus and particularly to a temperature stabilizable laser including an athermal mount in which the laser is assembled and which facilitates the temperature stabilization thereof.

The invention is especially suitable in an optical head containing a laser diode which provides a beam of light of sufficient intensity for laser printing purposes. Other applications of the apparatus provided by the invention may be found wherever operation of a laser, particularly a laser diode, outside thermal failure modes is desired. Such application may include optical communications and elsewhere where electrically operated lasers subject to thermal failure modes are used.

Various athermal mounts have been designed for the purpose of maintaining a laser diode at constant temperature with changes in ambient temperature and operating current. These mounts have included provisions for maintaining focus distances so that optical beams remain of desired area in cross-section, thereby maintaining spot size when such beams are used in laser printers. Typically, the designs involve an assembly including the laser diode and thermo-electric cooler. A temperature sensor in the form of a discreet element, usually a thermistor, is located in the assembly and must respond to the temperature of the assembly in order to follow any changes in the temperature of the laser. The thermal resistance between the thermistor and the laser, as well as the thermal mass or capacitance of the assembly, militates against rapid response to any changes in temperature. The temperature stability of the laser is therefore not maintained as closely to a temperature for safe non-failure mode operation of the laser, as is desired.

Another disadvantage of athermal mount designs which have proposed is their susceptibility to thermal gradients in a direction perpendicular to the optical axis along which the laser beam is projected. These thermal gradients complicate the design of the focus compensation mechanism using dissimilar materials for relatively movable members (inside and outside barrels) of an optical assembly containing a lens or lenses which collimates the beam from the laser diode. A design which utilizes inside and outside barrels of dissimilar material is found in a patent to Thomas E. Yates, U.S. Pat. No. 4,948,221 issued Aug. 14, 1990 and in a patent to Sarraf, U.S. Pat. No. 4,993,801 issued Feb.19, 1991.

Various athermal mount designs and designs of circuits for controlling the temperature of the laser in the mount (by supplying current to a thermo-electric or Peltier cooler) are found in the above-mentioned Yates and Sarraf patents and also in the following U.S. Pat. Nos.: Hori et al., 5,042,042, issued Aug. 20, 1991; Fisher et al, 5,029,335, issued Jul. 2, 1991; Levinson, 5,019,769, issued May 28, 1991; Kluitmans et al., 5,005,178, issued Apr. 2, 1991; Clark et al., 4,924,471, issued May 8, 1990; Bosch, 4,922,480, issued May 1, 1990; Pillsbury et al., 4,910,741, issued Mar. 20, 1990; Odagri, 4,884,279, issued Nov. 28, 1989; Shibanuma, 4,803,689, issued Feb. 7, 1989; Kaneko, 4,661,959, issued Apr. 28, 1987; Baer et al., 4,656,635, issued Apr. 7, 1987; Simmons, 4,061,728, issued Dec. 23, 1986; Sawai, 4,604,753, issued Aug. 5, 1986; Kovats et al., 4,399,541, issued Aug. 16, 1983; and Sato et al., 4,338,577, issued Jul. 6, 1982.

The deficiencies in existing athermal mount designs in providing temperature stabilization are exacerbated by the need to bring wiring to the laser diode and the thermo-electric cooler into the mount. Passages for wiring may cause heat leaks and establish thermal gradients which interfere with the performance of the optical compensating mechanism.

It is the principal object of the present invention to provide improved temperature stabilized laser apparatus in which the laser diode is mounted and arranged to decrease thermal resistance and reduce thermal mass or capacitance so as to provide for rapid stabilization of temperature of the laser due to changes in ambient temperature, laser operating current or other parameters.

It is another object of the present invention to provide an improved athermal mount for a laser diode in which the deficiencies and disadvantages mentioned above are substantially eliminated.

It is a further and more specific object of the present invention to provide an improved temperature stabilizable laser, and particularly an athermal mount containing an electrically operated laser, such as a laser diode, wherein the laser and the temperature sensing elements are integral parts of a thick film hybrid integrated circuit.

It is a more particular object of the invention to provide an improved athermal laser diode mount, including a chip having the diode as an integral part thereof, wherein temperature sensing elements are provided preferably using thick film temperature sensitive materials, distributed on the chip so as to respond rapidly to changes in temperature and particularly to changes which are to be corrected by a thermo-electric cooler with which the chip is in contact.

It is a still further and more particular object of the invention to provide an athermal laser diode mount including a thick film hybrid of which the diode is an integral part which facilitates electrical interconnections between the diode and external circuitry by providing terminals along one edge of the chip to which wires may readily be routed in the mount.

It is a still further and more particular object of the invention to provide an athermal laser diode mount in which the laser diode is part of a thick film hybrid integrated circuit wherein the diode and an optical assembly are constrained in a common reference plane perpendicular to the optical axis along which the laser beam projects thereby minimizing thermal gradients which might cause changes in beam location except along the optical axis thereby simplifying the design of the optical assembly of the mount.

SUMMARY OF THE INVENTION

Briefly described, a temperature stabilizable laser embodying the invention uses a housing in which an electrically driven laser is disposed. A thick film hybrid circuit has a substrate of thermally conductive and electrically insulating material on one side of which the laser is disposed and connected via a plurality of conductive paths to terminals preferably along one edge of the substrate. The substrate, preferably on the side thereof opposite to the side on which the laser is disposed, has distributed thereon temperature sensitive material which extends along different areas of the substrate which are spaced from each other and which constitutes a distributed circuit for sensing the temperature of the laser without interposing members or elements presenting thermal resistance or presenting a thermal mass or capacitance which can effect the stabilization of temperature of the laser by a thermo-electric cooler which is disposed in contact with the chip along the side of the substrate on which the distributed circuit is located. A mounting plate having a cavity in which the laser, integrated circuit chip is disposed, has a reference plane defined by surfaces against which the laser and an optical assembly for focusing and thereby collimating the light from the laser into a beam, bear thereby reducing the effect of thermal gradients in a direction transverse to the beam and facilitating thermal compensation of focus by the optical assembly. A heat exchanger is also attached to the plate and held in thermal contact with the cooler, sandwiching it against the substrate of the chip. Wire routing is facilitated through passages in the mounting plate which faces the side of the chip along which the terminals extend. Insulating material around the chip and the cooler within the plate further reduce thermal leaks and undesired thermal gradients in the mount.

BRIEF DESCRIPTION OF THE DRAWING

The foregoing and other objects features and advantages of the invention as well as a presently preferred embodiment thereof will become more apparent from a reading of the following description in connection with the accompanying drawings in which:

FIG. 4 is an exploded view showing the elements of the mount except for the optical assembly;

DETAILED DESCRIPTION OF PREFERRED EMBODIMENTS

Figure 1:
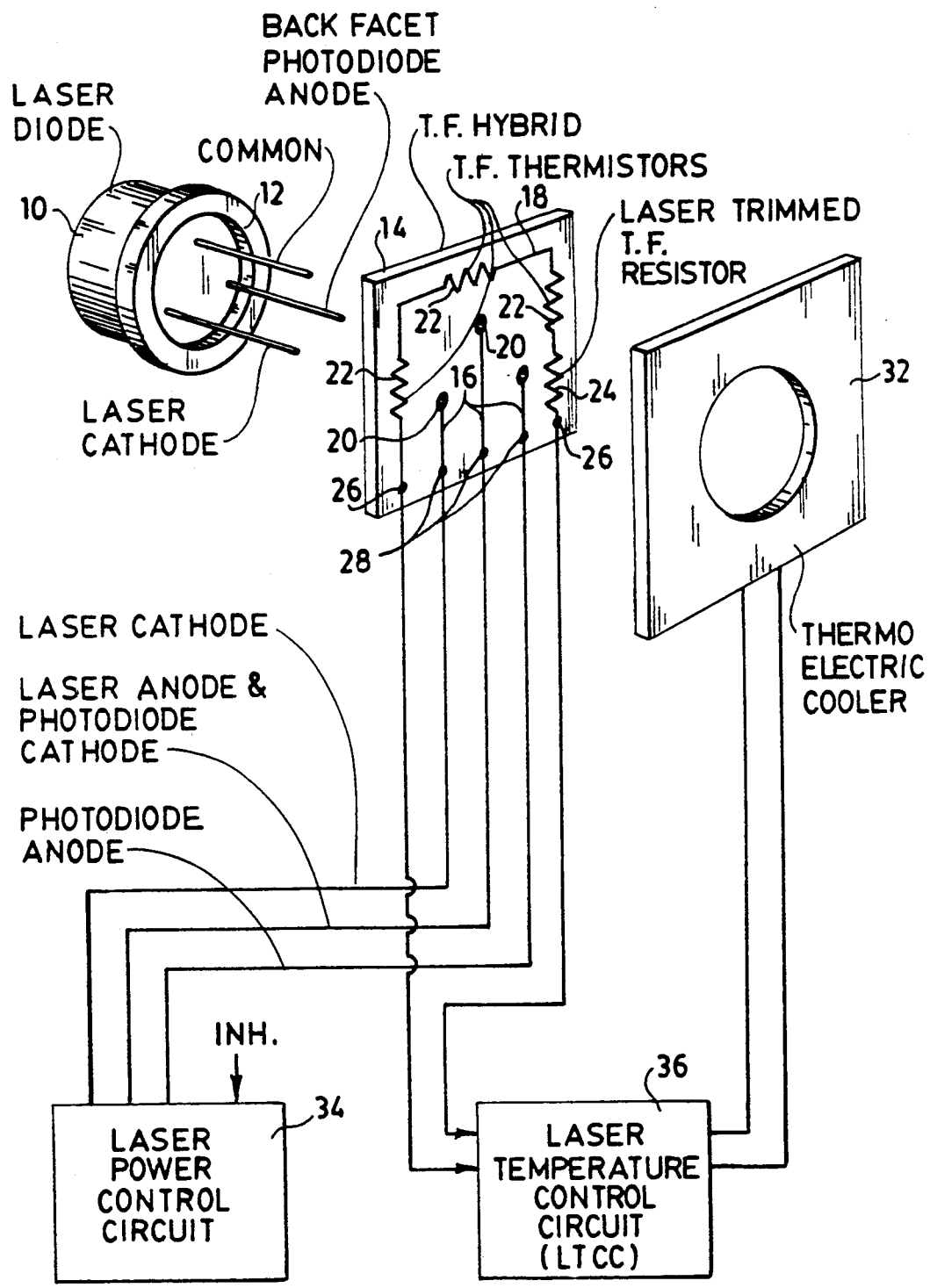
FIG. 1 is a schematic diagram illustrating the thick film hybrid integrated circuit, laser diode and the thermo-electric cooler in perspective and connected with the circuits which electrically drive the laser and control the temperature thereof.

Referring to FIG. 1, there is shown a laser diode 10, which is an electrically driven laser in a housing or can which is generally cylindrically shaped and has a generally cylindrical base 12. Three leads extend away from the base. They are a common lead which may also be provided by the can which is of conductive material (metal), but is shown as a third lead in the schematic representation shown in FIG. 1. The other leads are to the body of semi-conducting material providing the laser and to a photo diode which samples the intensity of light which the semi-conductor elements of the laser generates.

The laser 10 is integrated into a thick film hybrid circuit including a substrate 14 having conductive paths, 16 and 18. The paths 16 are made of conductive material, called thick film conductor ink, and extend through holes 20 which are lined with conductive material (sometimes called plated through holes). These holes provide connections for the leads from the base 12 of the diode 10. The paths 18 include of 3 types of materials or inks, namely temperature sensitive resistive material, resistive material which is not temperature sensitive and conductive material. The resistive material which is temperature sensitive is distributed in areas along a circuit along the rear side of the substrate 14. This temperature dependent material or ink is shown as three resistors 22 (R1, R2 and R3 in FIGS. 5 and 6) and constitute three thermistors. A resistor 24 (R4) which is not temperature sensitive is included in a series circuit with the temperature dependent resistors (thermistors 22). The resistors 22 and 24 are connected by the conductive material paths to terminals 26 at the end of the distributed thermistor circuit. The conductive paths 16 from the laser diode 10 are connected to terminals 28. These terminals are in-line along one edge of the substrate which is rectilinear (square). The laser diode is connected to an annular conductive path 30 (FIG. 5) with electrically and thermally conductive material (epoxy cement) and provides with the substrate 14 and the thermistors 22 and resistor 24 and the conductive paths thereon a thick-filled hybrid integrated circuit. Alternatively, the ground or common lead from the laser diode may be used. Then, the larger central one 43 of the plate through holes 41, 43, 45 may use a hold down connector to attach the laser diode to the substrate 14 and a conductive path provided to one of the terminals which then provides the ground or common for the circuit.

This chip is disposed against a thermo-electric cooler 32, which is a rectangular component having an opening therethrough which is made up of a series of solid state, silicon elements of opposite conductivity (PN) type. Such thermo-electric coolers are well-known in the art and commercially available. They are sometimes called Peltier coolers.

The electrical drive for the laser diode is provided by a laser power control circuit 34 which may also be of conventional design. It is external to the mount and is connected thereto by wiring which extends through the mount to the terminals 28. The terminals 26 are connected to a laser temperature control circuit (LTCC) 36. This circuit is connected to the terminals 26 and is responsive to the temperature of the laser as sensed by the thermistors 22, which are distributed in spaced areas of the substrate and in juxta-position to position with thermo-electric cooler 32. There is therefore a minimal thermal resistance and minimal thermal capacitance or mass to which the distributed thermistor circuit is presented. Rapid response to temperature changes occurs and the LTCC 36 responds to any changes to supply current in opposite directions (depending upon whether heating or cooling of the integrated circuit chip is desired and of the magnitude necessary to restore the temperature to the desired temperature, for example, a pre-determined temperature such as 25° C.

Figure 2:
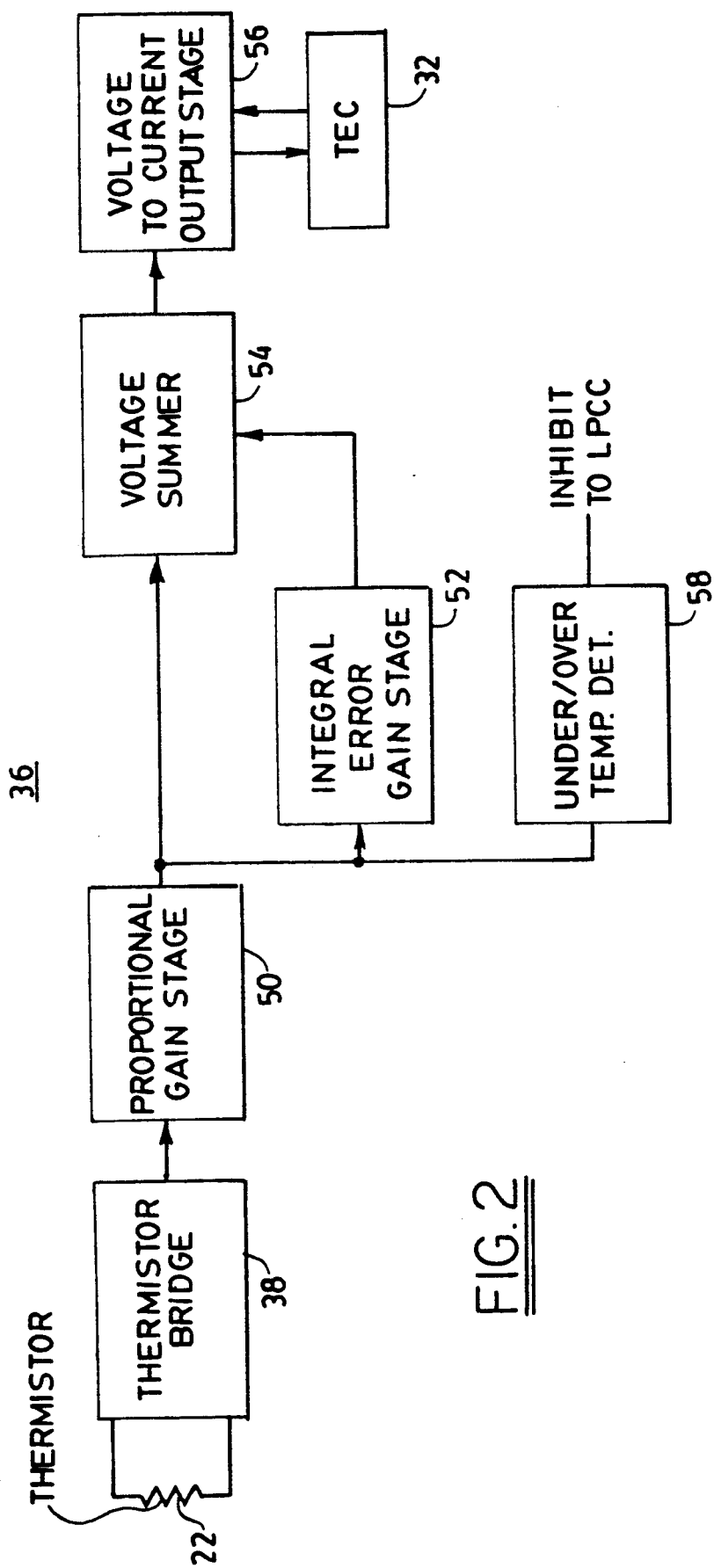
FIG. 2 is a more detailed block diagram than shown in FIG. 1 of the laser temperature control circuit (LTCC)
Figure 6:
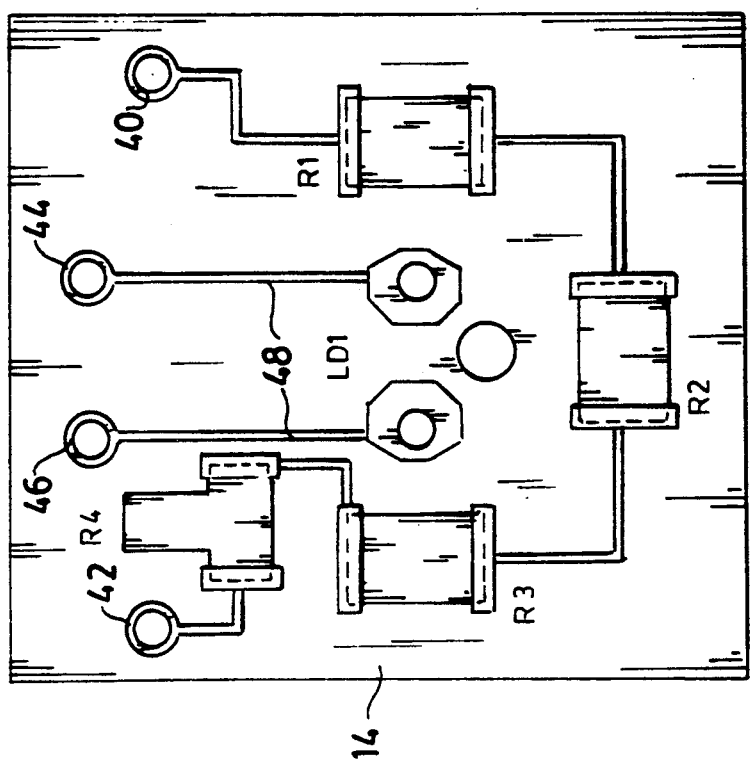
FIG. 6 is a plan view of the rear side of the substrate of the chip shown in FIG. 5.
Figure 5:
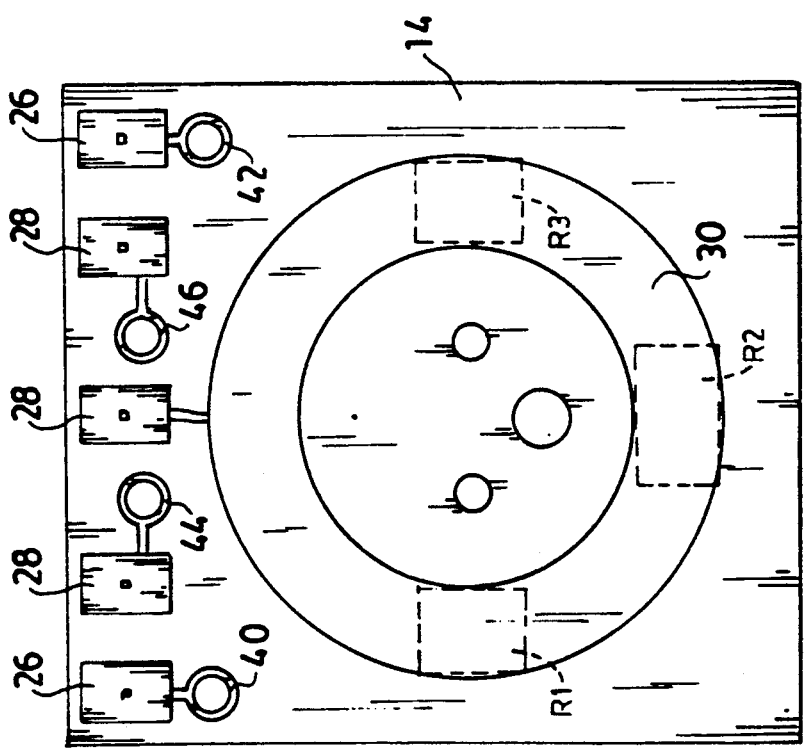
FIG. 5 is a plan view of the front facing side of the substrate of the hybrid thick film chip.

The LTCC 36 is shown in greater detail in FIG. 2. The thermistor circuit is shown generally as a single thermistor although it is in actuality distributed so as to provide the advantages of being presented with reduced thermal resistance and thermal mass as discussed above. The distributed thermistor provides integration or averaging of the temperature affecting the diode. The close thermal coupling through the substrate, which is of low thermal resistance, the small size of the hybrid and its thermal isolation from the housing and mounting, contribute to its low thermal capacitance. The thermistors are arranged so as to present a resistance at the pre-determined temperature which will balance a thermistor bridge circuit 38 including the thermistors 22 as one arm thereof. The thermistors are shown in greater detail in FIG. 6 as R1, R2 and R3. The fixed resistor is shown as R4. The resistors R1, R2 and R3 are approximately equal value and are connected by conductive lines and pads of conductive material which are disposed over the ends of the R1 through R4 elements. The R4 element may be trimmed as by laser trimming techniques known in the art to provide the resistance which balances the bridge at 25° C. Alternatively, there may be a potentiometer in the controller circuit (FIG. 3) which balances the bridge. FIGS. 5 and 6 also show plated through holes 40 and 42 which connect to pads on the side of the substrate 14 opposite to the side on which the thermistor circuit (R1 through R4) is located. It will be noted that the thermistor elements R1, R2 and R3 are in areas in alignment with the area 30 which provides the footprint, against which the rim at the rear of the base 12 of the laser diode is attached by the conductive epoxy. This arrangement not only minimizes the thermal resistance but also distributes the temperature sensitive thermistor circuit about the laser diode so that it can rapidly respond to any temperature changes therein and integrate or average the temperature variation affecting the diode 10. The annular ring 30 is connected to a central pad providing one of the terminals 28 while the other terminals 28 flanking the central terminal are connected via the plated through holes 44 and 46 and conductive paths 48 to the photo diode anode and laser cathode leads of the laser diode. The alternative attachment of the laser diode will change the paths, as discussed above.

Returning to FIG. 2, the control loop of the LTCC includes a proportional gain stage 50 which drives an integral gain stage 52. The outputs of both stages 50 and 52 are summed in a voltage summer 54 which drives a voltage current output stage 56. The TEC 32 is connected to the output stage which either sources or sinks current; driving current corresponding in magnitude to the output from the bridge 38 in a direction depending upon the polarity of the output from the bridge through the TEC 32. The proportional gain stage may be a operational amplifier connected in DC amplifier configuration to afford a gain of about 20 and a bandwidth of about 100 kHz. The integral stage is a operational amplifier having capacitive feedback to provide a time constant, suitably of 7.26 seconds. The proportional gain stage quickly responds to any changes in temperature with high gain at a rate faster than the integrator 52 can follow. When the temperature is stable, the integrator 52 integrates the error voltage from the proportional stage 50 to further stabilize the laser diode temperature. As a safety measure an over, under temperature detector 58 is connected to the output of the proportional gain stage 50. This is a window detector which detects when the output voltage from the stage 50 is above or below certain limits which are defined as the proper operating range of the laser diode by its manufacturer. When the limits are exceeded, an inhibit level is provided to the laser power control circuit which effectively shunts the laser cathode to the laser anode thereby putting the laser in a safe mode. The nature of the thermistor circuit may be designed for fail safe operation by using a positive rather than negative temperature co-efficient ink for the thermistors 22 (R1 through R3-FIG. 6 which then increase in resistance as the temperature increases).

Figure 3:
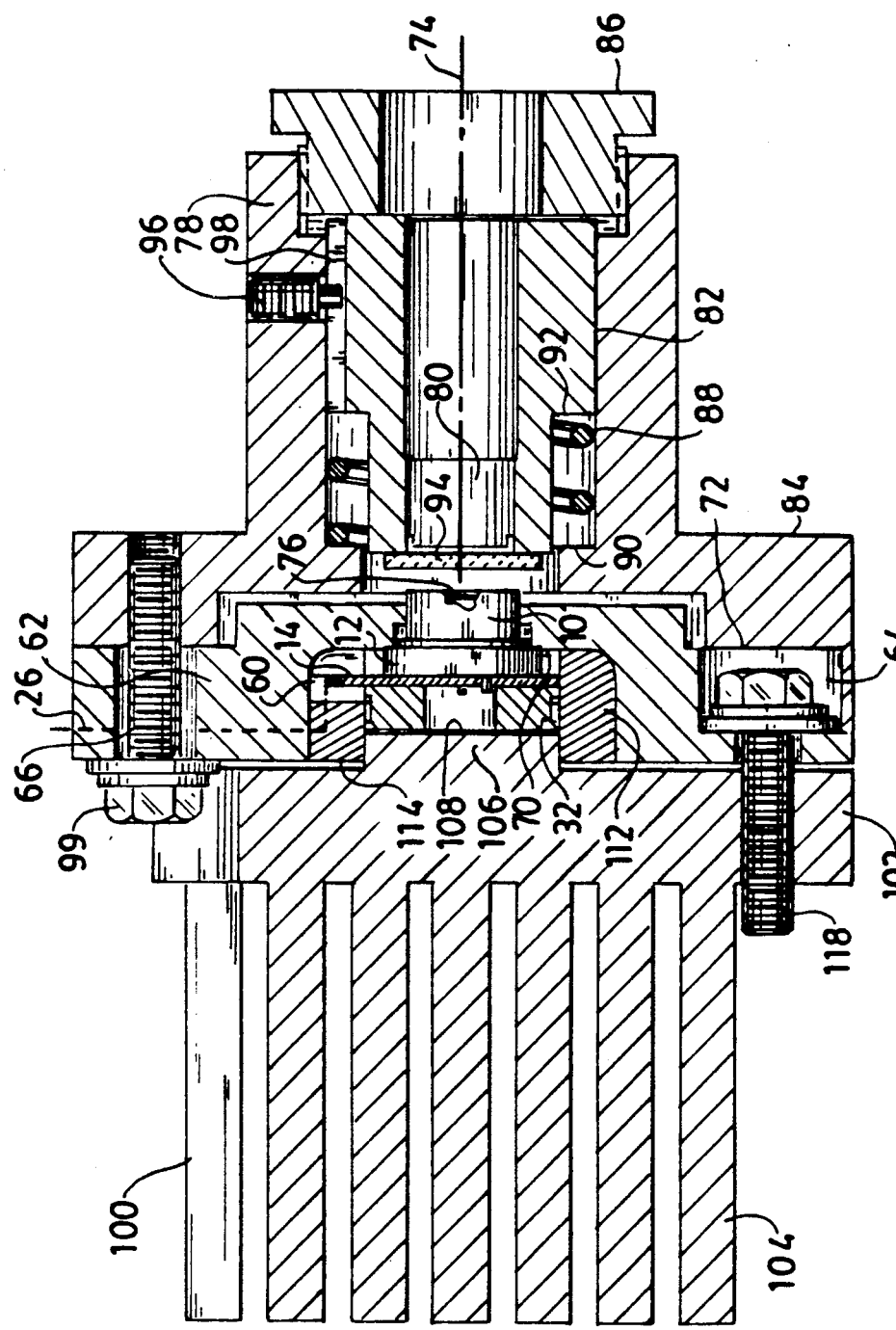
FIG. 3 is a sectional view along a generally horizontal diametral plane through an athermal mount embodying the invention.

Referring to FIGS. 3 and 4, the thick film hybrid circuit including the laser 10 and the substrate 14 is shown disposed in a cavity 60 of a mount plate 62. The plate 62 is of insulating material. Epoxy is suitable, but a machineable or moldable ceramic, such as a glass-mica composite, which is thermally and electrically insulating, is preferred. This mounting plate also has three countersunk holes 64 and three through holes 66 therein. The countersunk holes 64 are 120° apart as are the through holes 66.

The cavity 60 has a forward wall 70 and a shoulder 72 which respectively face rearwardly and forwardly and are disposed in a common reference plane perpendicular to the optical axis 74 of the mount. The laser diode 10 has a port 76 through which light emanates. This port 76 faces forwardly in a direction away from the substrate 14, and the laser light projects through the port.

An optical assembly 78 is mounted on the shoulder 72 while the integrated circuit and particularly the laser 10 is mounted (indexed or referenced) by being constrained to bear against the wall 70 in the case of the laser diode and the shoulder 72 in the case of the optical assembly 78. The optical assembly and the laser diode are thus constrained in the same plane which is perpendicular to the optical axis. The effect of thermal gradients is minimized, since the optical assembly which may be at a lower temperature than the laser diode is in the same plane therewith. This cancels the effect of expansion or contraction which could shift the laser diode axially with respect to the optical assembly 78. The optical axis 74 is also the axis of a lens unit 80 in an inner barrel 82 which is arranged in telescoping relationship in an outer barrel 84 of the optical assembly 78. Because the mount is symmetrical, lateral shifts are avoided.

The barrels 82 and 84 are of dissimilar material. They are spring-loaded into engagement by a focusing knob 86 which is threaded into the forward end of the outer barrel 84. A compression spring 88 is captured between shoulders 90 and 92 of the outer and inner barrels 84 and 82. The dissimilar material allows expansion or contraction along the optical axis, which is permitted by the spring 88. It will be observed that a cover plate of glass 94 is disposed at the rear end of the inner barrel 82 so as to provide for optical length correction, if necessary. A key and slot arrangement 96, 98 prevents the inner barrel from rotating and limits the movement thereof to translation along the optical axis.

Bolts 99 extend through the through holes 66 and attach the optical assembly 78 to the mounting plate. Prior to such attachment, the mounting plate is connected to a heat exchanger 100 having a baseplate 102 from which heat exchange elements or fins 104 extend. These fins may be plates, either vertical or radial, or rods as is conventional. The baseplate 102 has a boss 106 presenting a wall 108. The surface of this wall is disposed against the thermo-electric cooler (TEC 32) and sandwiches it against the substrate 14 of the thick film hybrid. The thermistor circuit is then distributed around one of the opposite sides of the cooler 32. So-called thermal pads 110 and 112 of very thin and therefore generally thermally conductive material, are disposed on opposite sides of the thermo-electric cooler and fill any voids or gaps thereby reducing the thermal resistance between the cooler and the integrated circuit on the forward side thereof and the cooler and the heat exchanger 100 on the rear side thereof.

A U-shaped arrangement of blocks 112 and another block 114 of thermally insulating material (suitably urethane foam) is disposed around the thermo-electric cooler, the hybrid circuit and around the projecting boss 106 to prevent long invective heat circulation and further thermally insulate the laser diode/integrated circuit and the thermo-electric cooler from the rest of the assembly. The leads 26 extend from the edge of the substrate and also the leads of the thermo-electric cooler extend from terminals along one edge thereof across the top of the pad 114 through passages 116 in the mount plate 62. These passages may be filled with insulating compound, such as RTV so as to provide further insulation against heat leakage from the hybrid thick film integrated circuit of the diode 10 and substrate 14 and thermo-electric cooler 32 and also to provide strain relief for the leads 26 and 28, as well as the leads from the thermo-electric cooler. The mount plate 62 is attached to the heat exchanger base plate 102 by bolts 118 which extend into the countersunk holes 64.

From the foregoing description it will be apparent that there has been provided an improved temperature stabilizable laser apparatus and particularly an athermal mount including a laser diode. Variations and modifications in the herein described structure, within the scope of the invention, will undoubtedly suggest themselves to those skilled in the art. Accordingly the foregoing description should be taken as illustrative and not in a limiting sense.

We claim:

1. Temperature stabilizable laser apparatus which comprises a housing, an electrically driven laser device in said housing, a thick film hybrid circuit having a substrate of thermally conductive and electrically insulating material, said substrate having opposite sides with a plurality of conductive paths, ends of said paths defining a plurality of terminals of said hybrid circuit, said hybrid circuit being in thermal contact with said housing and sections of said plurality of paths being in electrical contact with said laser, others of said plurality of paths extending in a circuit distributed about said substrate, said distributed circuit containing temperature sensitive material extending along different areas of said substrate which are spaced from each other, and a thermo-electric cooler having opposite sides, one of which is disposed in contact with said substrate over the areas along which said temperature sensitive material is distributed.

2. The apparatus according to claim 1 wherein said distributed circuit being disposed on one of said opposite sides of said substrate, said one of said opposite sides being in thermal contact with said cooler, and said laser being disposed on the other of said opposite sides of said substrate.

3. The apparatus according to claim 2 wherein said housing has a base, said base being disposed in thermal contact with said substrate along a contact area on said one of said opposite sides of said substrate, said different areas of said substrate along which said distributed circuit extends being on the opposite side of said substrate in alignment with said contact area.

4. The apparatus according to claim 3 wherein said temperature sensitive material define discrete thermistors which are interconnected by portions of said plurality of conductive paths and which are spaced from each other along said contact area.

5. The apparatus according to claim 3 wherein said contact area is annular in shape, said housing base also being of annular shape corresponding to the shape of said contact area.

6. The apparatus according to claim 5 wherein said contact area is a layer of conductive material providing an electrical connection to said laser.

7. The apparatus according to claim 1 wherein said substrate is generally rectilinear in shape and has a plurality of edges, said thermistor being disposed along three of said edges, a pair of said plurality of terminals defining the opposite ends of said distributed circuit, other of said plurality of terminals being connected via different ones of said paths to said laser.

8. The apparatus according to claim 1 wherein in said laser is a laser diode and said housing is a can containing said laser diode, said can having an optical port in an end thereof spaced away from said substrate through which light projects when said laser diode is electrically driven.

9. The apparatus according to claim 7 wherein said laser has a base and a plurality of leads extending through said base, holes in, said substrate material to which different ones of said a plurality of pads which provide the laser connections extend from said terminals, said leads extending through said holes and being connected to said leads which provide said laser connections.

10. The apparatus according to claim 9 wherein said terminals are pads of conductive material on the same side of said substrate on which said laser is disposed.

11. The apparatus according to claim 7 further comprising means including a mount plate having an opening in which said hybrid circuit including said laser and said cooler are captured, a passage in said plate extending to said opening opposite to said edge along which said terminals are disposed through which electrical wires which are connected to said terminals can extend.

12. The apparatus according to claim 7 further comprising a mount plate having an opening in which said laser, said hybrid circuit and said cooler are disposed, said laser housing having an optical port through which light generated by said laser projects in a direction away from said substrate, said plate having a shoulder outside said opening and a wall inside said opening which define opposed surfaces of said mount plate which are located in the same plane generally perpendicular to the direction in which said light projects, an optical assembly including means for focusing said light in a beam along an optical axis having a reference surface generally perpendicular to said axis disposed on said shoulder thereby minimizing thermally induced displacements of said optical assembly along said axis.

13. The apparatus according to claim 12 wherein said optical assembly comprises an outer barrel, an inner barrel disposed in telescoping relationship inside said outer barrel, said focusing means being a lens captured in a hole through said inner barrel, a pair of shoulders extending radially inwardly and outwardly with respect to said axis from said inner and outer barrel and defining an annular cavity, a compression spring around said inner barrel in said cavity, a focus adjusting knob screwed into said outer barrel and bearing against said inner barrel for retaining said inner barrel loaded against said spring in said outer barrel.

14. The apparatus according to claim 12 further comprising a heat exchanger having a forward end with a wall defining a surface and a rear end from which heat exchange members extend, said heat exchanger being connected to said mounting plate with said wall bearing in thermal contact against the opposite sides of said cooler, sandwiching said cooler between said chip and said forward end wall of said heat exchanger.

15. The apparatus according to claim 14 wherein said opening in said mounting plate encompasses said wall, and members of heat insulating material being disposed in said opening around said cooler and said wall, said substrate having a plurality of edges along one of which said terminals extend, said members of heat insulating material encompassing said substrate at least around all the edges thereof except said one of said edges.

16. The apparatus according to claim 1 further comprising means responsive to said distributed circuit containing said temperature sensitive material for operating said cooler to maintain said hybrid circuit, including said laser at a predetermined temperature at which said laser is operative reliably outside an oven temperature failure mode thereof.

17. The apparatus according to claim 16 wherein said cooler operating means comprises means for providing an electrical signal corresponding in amplitude and polarity to the variation in temperature of a thermistor defined by said temperature sensitive material of said distributed circuit from said predetermined temperature, a proportional gain stage to which said signal is applied, an integral gain stage responsive to the output of said proportional gain stage and means operated by both said proportional and integral stages for supplying current to said cooler in an amplitude and in a direction corresponding to the sense and the amplitude and polarity of said electrical signal.

* * * * *